United States Patent [19]

Hamilton et al.

[11] Patent Number: 5,763,951
[45] Date of Patent: Jun. 9, 1998

[54] NON-MECHANICAL MAGNETIC PUMP FOR LIQUID COOLING

[75] Inventors: Robin E. Hamilton, Millersville; Paul G. Kennedy, Grasonville; Christopher R. Vale, Elkridge, all of Md.

[73] Assignee: Northrop Grumman Corporation, Los Angeles, Calif.

[21] Appl. No.: 681,345

[22] Filed: Jul. 22, 1996

[51] Int. Cl.[6] .................................................. H01L 23/34
[52] U.S. Cl. ............................................ 257/714; 257/706
[58] Field of Search .................................. 257/714, 715, 257/716, 706

[56] References Cited

U.S. PATENT DOCUMENTS

2,612,109  9/1952  Wakefield .
5,380,956  1/1995  Loo et al. .......................... 257/714
5,522,452  6/1996  Mizuno et al. .................... 257/714
5,620,646  4/1997  Sparer et al. ...................... 257/714

*Primary Examiner*—Mahshid D. Saadat
*Assistant Examiner*—S. V. Clark
*Attorney, Agent, or Firm*—Walter G. Sutcliff

[57] ABSTRACT

A liquid cooling system contained completely on a circuit board assembly. The liquid cooling system uses microchannels etched within the circuit board, those microchannels being filled with electrically conductive fluid that is pumped by a non-mechanical, magnetic pump. The pump can be separate from the device on the circuit board which is to be cooled or it can be integrated with the device that is to be cooled. In the latter circumstance, the same current which flows through the electronic device is the current which generates the Lorentz force that pumps the electrically conductive fluid through the microchannel.

13 Claims, 5 Drawing Sheets

NON-MECHANICAL MAGNETIC PUMP FOR LIQUID COOLING

CROSS REFERENCE TO RELATED APPLICATIONS

This application is related to copending U.S. patent application Ser. No. 08/681,207 (WE58,813) entitled, "Microchannel Cooling Of High Power Semiconductor Devices", Robin E Hamilton et al, filed on Jul. 22, 1996; and U.S. patent application Ser. No. 08/681,344, (58,811) entitled, "Closed Loop Liquid Cooling Within RF Modules", Robin E. Hamilton et al, filed on Jul. 22, 1996.

BACKGROUND OF THE INVENTION

1. Technical Field

The present invention relates to devices, and the methods embodied therein, for liquid cooling of circuit board assemblies. More particularly, the liquid for cooling the circuit board assembly is pumped via a non-mechanical, magnetic pump.

2. Description of the Prior Art

It is known that an electric current can be used to pump an electrically conductive fluid without the use of moving parts. U.S. Pat. No. 2,612,109 discloses such a magnetic, non-mechanical pump that is to be fitted around an electrically conductive pipe.

In an unrelated technological area, for at least the last 20 years, the electronics industry has demanded solid-state switching devices that operate faster, handle more power, are smaller, and cost less. The semiconductor industry has responded with the advent of such devices as MOSFETs and insulated gate bipolar transistors (IGBTs). These devices have offered tremendous advancements in such applications as power supplies and motor controllers. Densely packaged, low cost devices that handle kilowatts of power have been developed. These devices, however, are still limited internally by power density and thermal considerations.

From a reliability perspective, the electronics industry has gravitated toward air cooled devices. For example, the Federal Aviation Administration (FAA), requires radar systems to be air cooled. Likewise, though not formally required, television broadcasters greatly prefer air cooled electronic devices.

Prior art air cooled electronic packaging frequently includes redundant parts in order to compensate for the limited capacity of air cooled designs, resulting in greater system cost, size, and weight. For example, consider the air cooled ARSR-4 solid state transmitter developed by the Westinghouse Electric Corporation. This is an example of a transmitter using radio frequency (RF) power transistors that are designed to operate below their power output capability. In addition, in order to meet military standard operating temperatures when plural ARSR-4 transistors are being used, the transistors must be spaced inches from one another, which is an inefficient use of the surface area of the circuit board assembly. In effect, the number of transistors and related peripheral circuits that are required in a solid state transmitter is a function of the thermal capacities of the prior art transistor packaging and air cooling systems.

Figure 1:
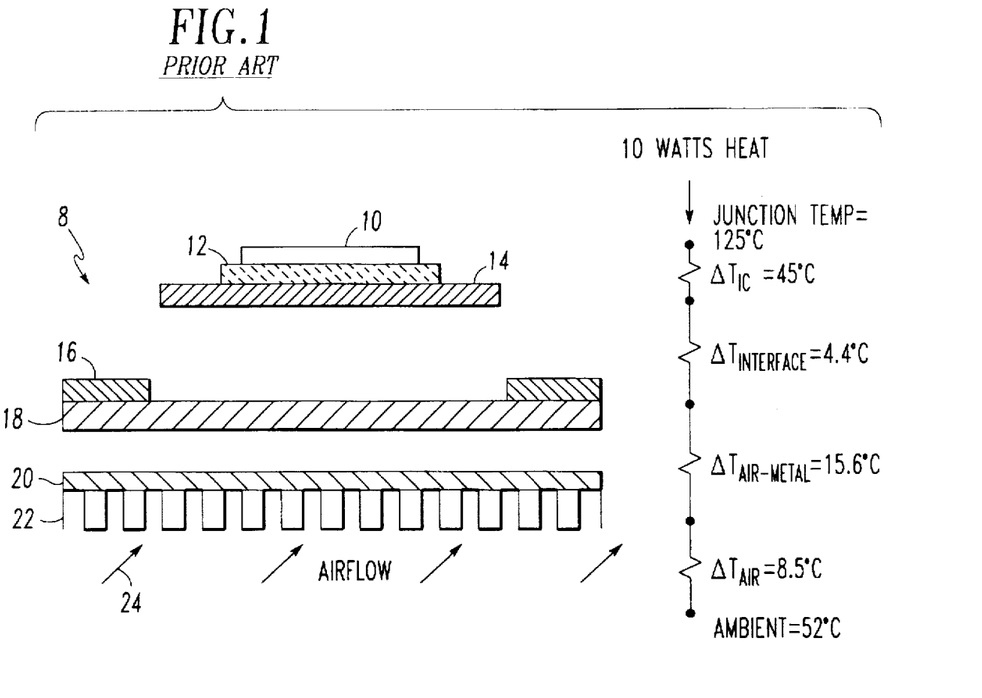
FIG. 1 is a diagrammatic depiction of the prior art ARSR-4 solid state transmitter and a thermal model therefore.

The ARSR-4 packaging approach has been embraced by the industry for several years due to its simplicity, low cost, and customer acceptance. FIG. 1 depicts the prior art ARSR-4 air cooled RF module along with a thermal model thereof. The ARSR-4 module 8 includes: a transistor chip 10; a ceramic layer 12; a flange 14; a soft substrate 16; a ground plane 18; a cold plate 20; fins 22; and arrows 24 representing air flow. Items 10, 12 and 14 form the transistor, items 16 and 18 form the bare circuit board, and items 20 and 22 form the coldplate.

The thermal model in FIG. 1 shows that the prior art packaging, along with the maximum air flow that can be realized, limit the maximum heat dissipation of an air cooled silicon RF transistor to about 10 Watts. The maximum device junction temperature, T, as dictated by system reliability studies, is usually desired to be in a range 125° C.$\leq$T$\leq$135° C. Technological advancements in high power transistor designs have begun to exceed the cooling capacity of the prior art air cooled designs.

Further enhancements to improve the thermal efficiency of prior art air-cooled designs are difficult in practice. Increasing the mass flow rate of air over a module is difficult. For example, the ARSR-4 transmitter generates over 12 kilowatts average heat dissipation. The blower used to cool this very large system is 20 hp, rated to deliver approximately 10,000 cubic feet per minute of air at 8 inches of water pressure drop. This blower is excessively large, expensive, and noisy. Alternatively, the thermal interface between the transistor flange 14 and the substrate-16/ground plane-18 can be improved with solder. Unfortunately, this adds considerable costs in module rework.

Liquid cooling, in contrast, provides greater heat dissipation capacity. Nevertheless, as discussed above, many end users have strong objections to liquid cooling. Liquid cooling is perceived as expensive and heavy, having reduced reliability, and excessive maintenance problems due to leaks, fouling, and corrosion. In addition, many applications simply do not have liquid cooling available.

CONVENTIONAL ART

In the above referenced related copending patent applications assigned to the same assignee as the present application, liquid cooling has been applied to circuit board assemblies to enhance the power density capabilities thereof. In particular, this new approach to liquid cooling is based upon the concept of microchannels. Microchannel cooling forces dense fluids through very small channels located as close as possible to the heat source. Typically, cooling channels are embedded either within the circuit board itself and/or within the substrate of the electronic device. A typical microchannel is sized as follows: 25 μm wide; 1.5 μm deep; and 7.1 μm long.

The preferred embodiments of the microchannel technology keep the fluid-path entirely on a circuit board assembly. As such, no fluid connections need be severed in order for the circuit board to be removed for repair or replacement. This enhances the reliability of this liquid cooled technology.

A pump, residing on the circuit board assembly, becomes desirable to circulate the coolant in the microchannel. From a reliability perspective, a device having moving parts, such as a pump, is a liability because, generally, devices with moving parts are less reliable than devices having no moving parts. Thus, there exists a need for a pump, small enough to fit on a circuit board assembly, that can pump the coolant through the microchannel without employing moving parts.

SUMMARY OF THE INVENTION

It is an object of the present invention to provide a liquid cooling system for a circuit board assembly that is completely contained on that circuit board assembly.

It is a further object of the present invention that the liquid cooling system employ microchannels.

Here is a further object of the present invention that the coolant of the liquid cooling system be pumped by a non-mechanical pump.

These and other objects of the present invention are fulfilled by providing a method of cooling a device having a liquid cooling system, the method including: using an electrically conductive fluid as the coolant; and using the fluid to conduct at least a portion of the electricity flowing in an electrical current path. This method further includes inducing a magnetic field orthogonal to a direction that the electricity flows and orthogonal to a direction of fluid flow, to thereby pump the fluid in the system via a resulting non-mechanical, Lorentz force.

Such objects of the present invention are also fulfilled by providing a liquid cooling system resident on a circuit board assembly, and the method embodied therein, comprising: a circuit board, a cooling channel, having a channel wall located within the circuit board; coolant filling the channel; and a non-mechanical pump having a fluid connection to the channel, for circulating the fluid within the channel. The liquid cooling system further includes an electrical power source supplying electric power along an electrical current path. The coolant is electrically conductive fluid. The non-mechanical pump is partially formed as a section of the channel. At least a portion of the channel wall in the pump section of the channel is electrically conductive. The electrically conductive portion of the channel wall is electrically connected to the electrical current path, such that the fluid and the electrically conductive channel wall portion together form part of the electrical path and electric current flows across the channel orthogonal to a direction of fluid flow in the channel. The non-mechanical pump includes a magnetic field source inducing a magnetic field orthogonal to each of the direction of the fluid flow in the channel and the direction of the electrical current across the channel. The orthogonal orientation between the magnetic field and the electrical current exerts an orthogonal Lorentz force on the fluid as a function of a cross product of the electrical current and the magnetic field. As such, the orthogonal Lorentz force pumps the fluid along the channel. The pumped fluid cools, via conduction, a proximate device.

Such objects of the present invention are also fulfilled by providing an integrated semiconductor device and non-mechanical magnetic pump, and the method embodied therein. The semiconductor device includes at least a first layer of semiconductor material deposited against a second layer of semiconductor material to form a junction. This integrated system includes: a channel within the first layer of semiconductor material; a magnetic field source inducing a magnetic field within, and perpendicular to, a thickness of the first layer; and an electrically conductive fluid within the channel. The electric current, for energizing the semiconductor device, is transmitted through the first layer parallel to the thickness of the layer. The fluid in the channel conducts a portion of the current. The current is orthogonal to the magnetic field such that an orthogonal Lorentz force is exerted on the fluid as a function of a cross product of the electrical current and the magnetic field. As such, the orthogonal Lorentz force pumps the fluid along the channel thereby cooling the junction.

Further scope of applicability of the present invention will become apparent from the detailed description given hereafter. However, it should be understood that the detailed description and specific examples, while indicating preferred embodiments of the invention, are given by way of illustration only, because various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limited of the present invention and wherein . . .

DETAILED DESCRIPTION OF THE PREFERRED EMBODIMENTS

Figure 2:
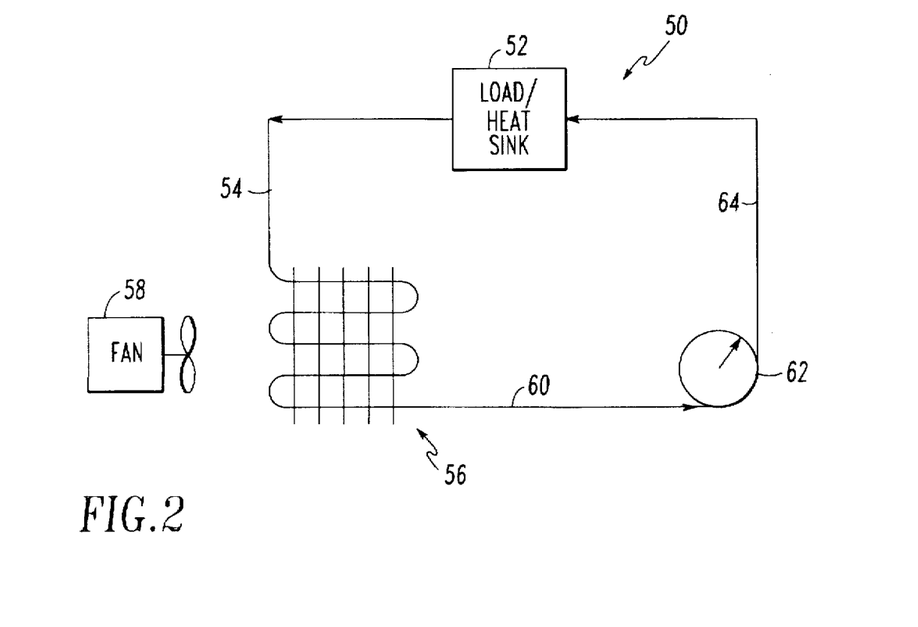
FIG. 2 is a block-level diagrammatic depiction of the liquid cooling system, for a circuit board assembly, of the present application.

FIG. 2 is a diagrammatic depiction of a liquid cooling system embodiment of the present application, residing completely on a circuit board assembly. Such a circuit board assembly is referred to as the module 50. The module 50 includes: the load/heat sink 52; the fluid connection 54; the heat exchanger 56; the fluid connection 60; the non-mechanical magnetic pump 62; and the fluid connection 64. In addition, a fan 58 is depicted for forcing air past the heat exchanger 56.

The non-mechanical, magnetic pump 62 circulates coolant to the load/heat sink 52 via the fluid connection 64. The coolant absorbs heat energy from the load/heat sink 52 by conduction on its way to the heat exchanger 56 via the fluid connection 54. At the heat exchanger 56, heat energy is transferred from the coolant to the air adjacent the circuit board assembly by convection. The fan 58, which is not a necessary component, moves air past the heat exchanger 56. The now-cooled coolant is circulated back to the pump 62 via the fluid connection 60.

Figure 3:
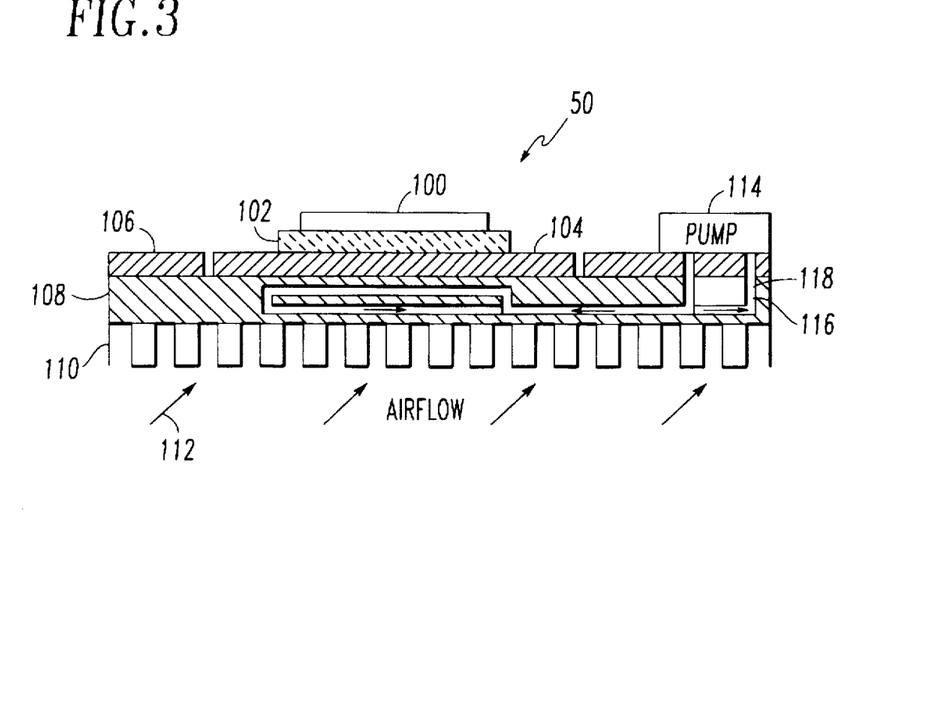
FIG. 3 is a cross-sectional view of the liquid cooling system, for a circuit board assembly, of the present application.

FIG. 3 is a cross-sectional view of the module 50 of FIG. 2. The module 50 includes: a semiconductor device, for example, a transistor chip, 100; a ceramic layer 102; a flange 104; a soft substrate 106; a ground plane/air to liquid heat exchanger 108; fins 110; arrows depicting airflow 112; a non-mechanical, magnetic pump 114; coolant 116; and a channel 118 in which the coolant 116 flows.

The module 50 of FIG. 3 represents a packaging approach which achieves the simplicity of air cooling, something mandated by the user, while providing the thermal efficiency of a liquid cooling system. This module 50 is a closed loop in the sense that the entire fluid circuit is contained on the circuit board assembly. As such, when a module 50 is replaced, no plumbing is involved, i.e., no fluid connection must be broken. The printed wiring board 106, 108, and 110 doubles as an air-to-liquid heat exchanger.

Figure 4:
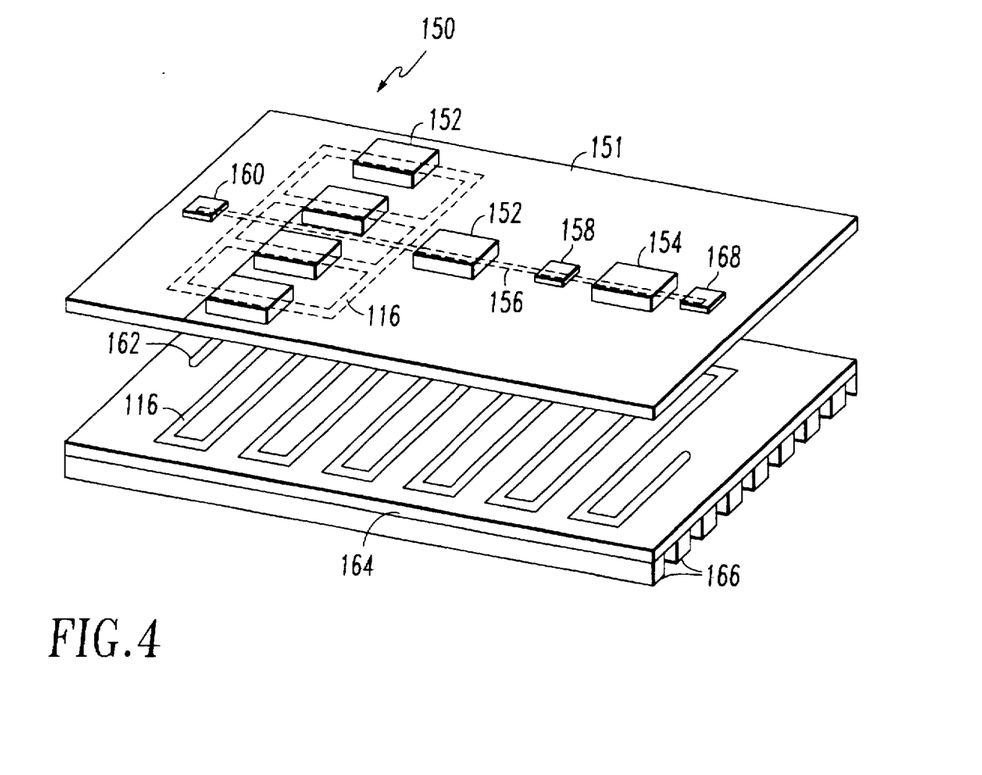
FIG. 4 is an exploded view of the liquid cooling system, for a circuit board assembly, of the present application.

FIG. 4 depicts an exploded view of an alternative embodiment of the module 50, namely, the module 150. The module 150 includes: a circuit board 151; semiconductor devices, for example, power transistors or motor controllers, 152; a non-mechanical, magnetic pump 154; a fluid connection, i.e., a channel 156; coolant 116; a check valve 158; a fill port/vent 160; a channel 162; a liquid to air heat exchanger 164; fins 166; and a check valve 168.

FIG. 4 corresponds to the common situation in which the module 150 has one transistor 152 that drives four other transistors 152. A single non-mechanical, magnetic pump 154 circulates fluid in the channel portions 156, and 162 to cool a total of five transistors 152. This is in contrast to the one pump 114 to the one transistor chip 100 ratio depicted in FIG. 3. FIG. 4 also shows that the channel portion 162 has a serpentine arrangement, thereby increasing the overall length or effective size of the heat exchanger 164.

Figure 5:
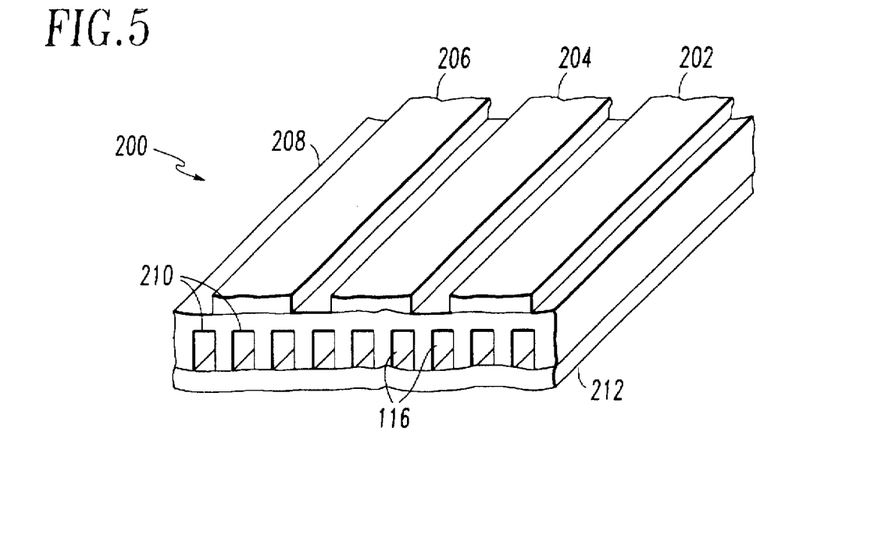
FIG. 5 is an exploded view of the microchannels formed in, and the electronic devices attached to, the circuit board for the liquid cooling system of the present application.

FIG. 5 depicts a cross-section of an alternative module 200. The module 200 includes: semiconductor devices 202, 204, and 206; a substrate 208; coolant channels 210; coolant 116; and a channel closure 212.

A microchannel heat sink, formed by the combination of the coolant channels 210 and the channel closure 212, is similar to a conventional finned heat sink, except for a fundamental difference in the dimensions. A typical microchannel is on the order of 0.001 inches wide by 0.004–0.006 inches deep.

Microchannels enhance heat transfer in two ways, first, the narrow channels can be closely spaced, giving a large number of fins with a combined surface area much greater than the "footprint" of the heat sink. Second, the small hydraulic diameters of the microchannels result in high convection heat transfer coefficients.

The thermal conductivity of a heat sink is proportional to the product of the convective heat transfer coefficient and the surface area. As such, microchannels allow an increase in the maximum power density for a given operating temperature. The superior performance of a microchannel heat sinks enables minimal flow to remove heat effectively from a hot component. The reduced flow requirements enable a small capacity pump to supply adequate amounts of coolant to a heat generating device. In addition, closed loop liquid cooling contained completely on a circuit board assembly preserves the cleanliness of the coolant, due to minimal introduction of outside impurities and debris. Such cleanliness is required of the coolant used in microchannels because of the tiny dimensions involved.

Figure 6:
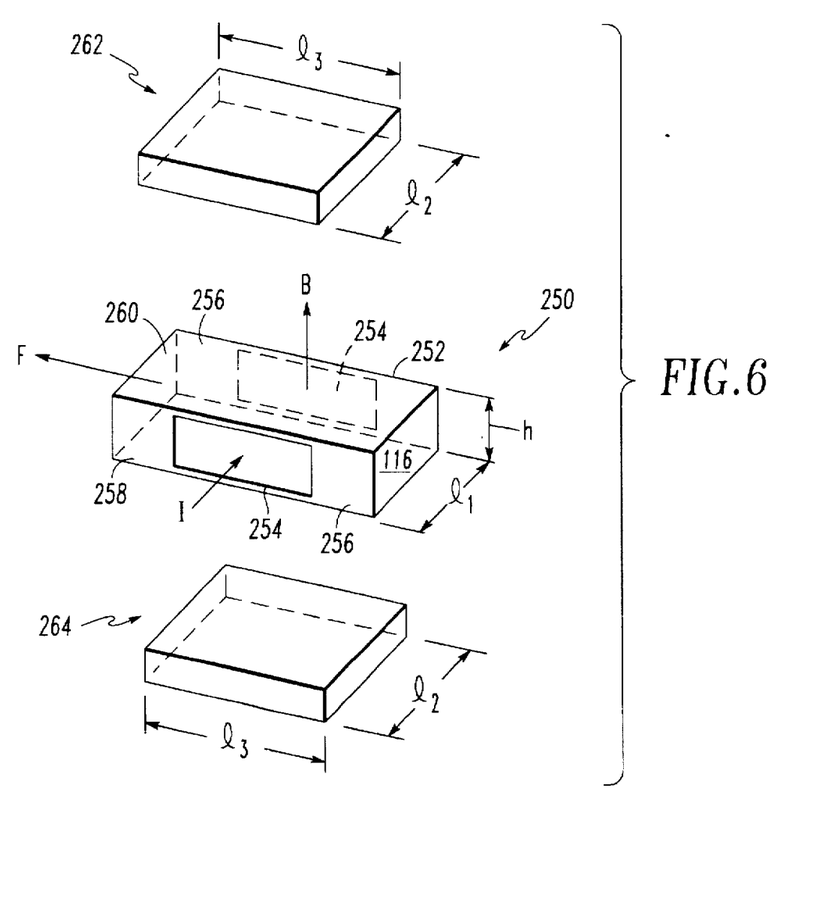
FIG. 6 is an exploded view of the non-mechanical, Lorentz force pump of the present application.

FIG. 6 is an exploded view of the non-mechanical, magnetic pump 250. The pump 250 is integrated into the channel 252 and has a conductor cross-section 254. The channel 252 includes the channel wall 256, the channel floor 258, and the channel ceiling 260. FIG. 6 also shows the magnetic field sources 262–264.

The non-mechanical, magnetic pump 250 of FIG. 6 operates as follows. The Lorentz force is defined by the following equation:

$$\vec{F} = q * \vec{v} \times \vec{B} \tag{1}$$

In equation No. 1, q is the charge, $\vec{v}$ is the velocity of the charge, $\vec{B}$ is the magnetic field in which the charge is travelling, and $\vec{F}$ is the force on the charge due to the cross product of the velocity and magnetic field vectors.

Rewriting equation 1 in terms of the current travelling in a conductor results in the following equation:

$$\vec{F} = I * \vec{l} \times \vec{B} \tag{2}$$

In equation 2, I is the value of the current and $\vec{l}$ is the length over which the current is travelling. An exemplary calculation of the magnitude of the Lorentz force follows.

With the exception of the conductor cross-sections 254, the channel walls 256, as well as the channel floor 258 and the channel ceiling 260 are electrically non-conductive. All of the electrical current will travel through the coolant in the region between the two conductor cross-sections 254, in a direction parallel to $\vec{l}$.

The coolant 116 in the channel 252 is electrically and thermally conductive. A typical average current available in a transmitter transistor circuit is one ampere. The power consumption of the non-mechanical, magnetic pump 250 is minimal such that no additional power need be supplied beyond what is already available from the transistor.

As for the magnetic field sources 262 and 264, a typical field between two commercially available neodymium-iron-boron alloy permanent magnets is 2700 Teslas. It is preferred to use two magnetic field sources whose fields combine in the region defined between the conductor cross-sections 254, but a single magnetic field source could also be used. An electromagnet could also be used as the field source.

A one inch square magnet has the following magnetic field area:

$$A_{mag} = l_2 * l_3 = 1 \text{ sq. in.} \tag{3}$$

To reiterate, FIG. 6 is an exploded view, thus, the magnetic field sources 262 and 264 are shown displaced from the channel 252. In a reduction to practice, the magnetic field source 262 is positioned as closely as possible against the channel ceiling 260 while the magnetic field source 264 is positioned as closely as possible against the channel floor 258. If the gap between the two magnetic field sources 262 and 264, equals 0.25 inches, then the gap area is defined as follows:

$$A_{gap} = (l_2 + h) * (l_3 + h) = 1.56 \text{ in.} \tag{4}$$

The gap dimension, h, is added (in the $A_{gap}$ calculation) to both the length $l_3$ and the width $l_2$ according to the well-known, empirically derived technique for compensating the effects of fringing in short gaps. This gap area is only valid for a gap length less than the length of the magnetic face. Magnetic size and gap length are chosen arbitrarily to achieve the desired size and resultant forces. Thus, the magnetic force across the gap is calculated as follows:

$$B_{gap} = B_{mag} * (A_{mag}/A_{gap}) = 1731 \text{ Teslas} \tag{5}$$

7

The resultant force applied to the coolant is:

$$F = (1 \text{ amp})*(0.0254 \text{ m})*(1731 \text{ Teslas}) = 44 \text{ Newtons} \quad (6)$$

The resultant pressure on the coolant is:

$$\begin{aligned} P &= (44 \, N)/(0.0254 \text{ m} * 0.00635 \text{ m}) \quad (7)\\ &= 27.3(10^4) \text{ N/m}^2 \\ &= 39.6 \text{ lbs/in.}^2 \end{aligned}$$

This pressure is adequate to move an electrically conductive fluid through a closed loop coolant path contained completely on a circuit board assembly.

Figure 7:
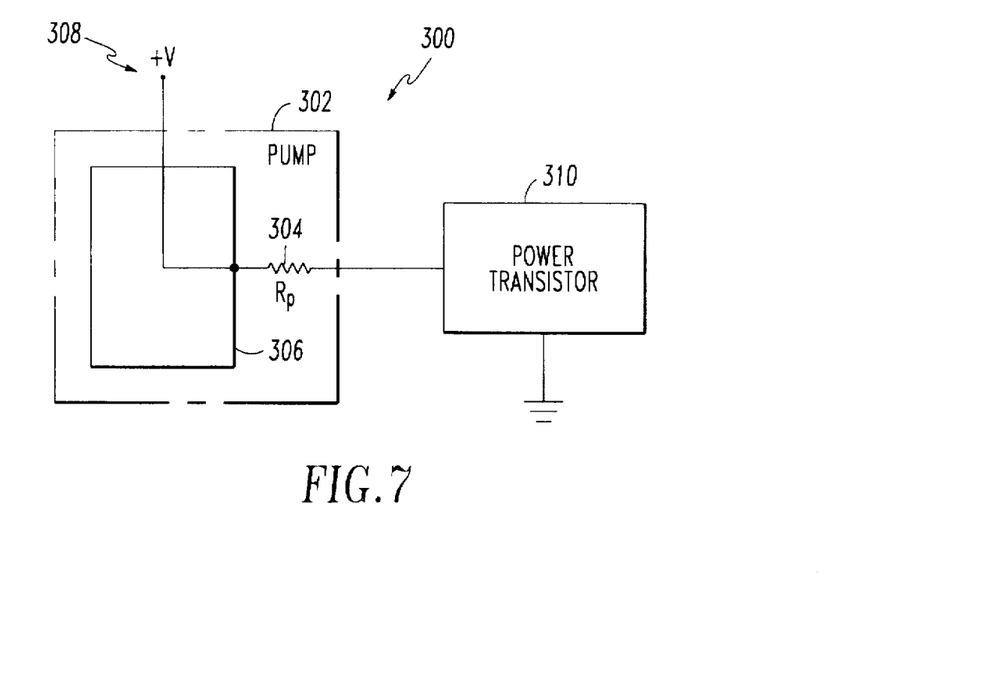
FIG. 7 is a circuit diagram of the non-mechanical, Lorentz force pump of the present application.

FIG. 7 depicts a schematic representation of a module 300. The module 300 includes: a non-mechanical, magnetic pump 302; a voltage source 308; and a power transistor 310. The power line sourcing the transistor 310 also sources current for the pump 302. The pump could be similarly formed into any other circuit on the board. The pump 302 includes a pump resistance $R_p$ 304 and an electrically conductive coolant loop 306.

Because the fluid in the channel is electrically conductive, the entire channel is viewed as the loop 306. Nevertheless, as discussed above, electricity only flows across the region defined by the conductor cross-sections 254. The energy that is transformed into work by the pump 302 is accounted for by the voltage drop across the pump resistance $R_p$, which is a relatively small resistance.

Figure 8:
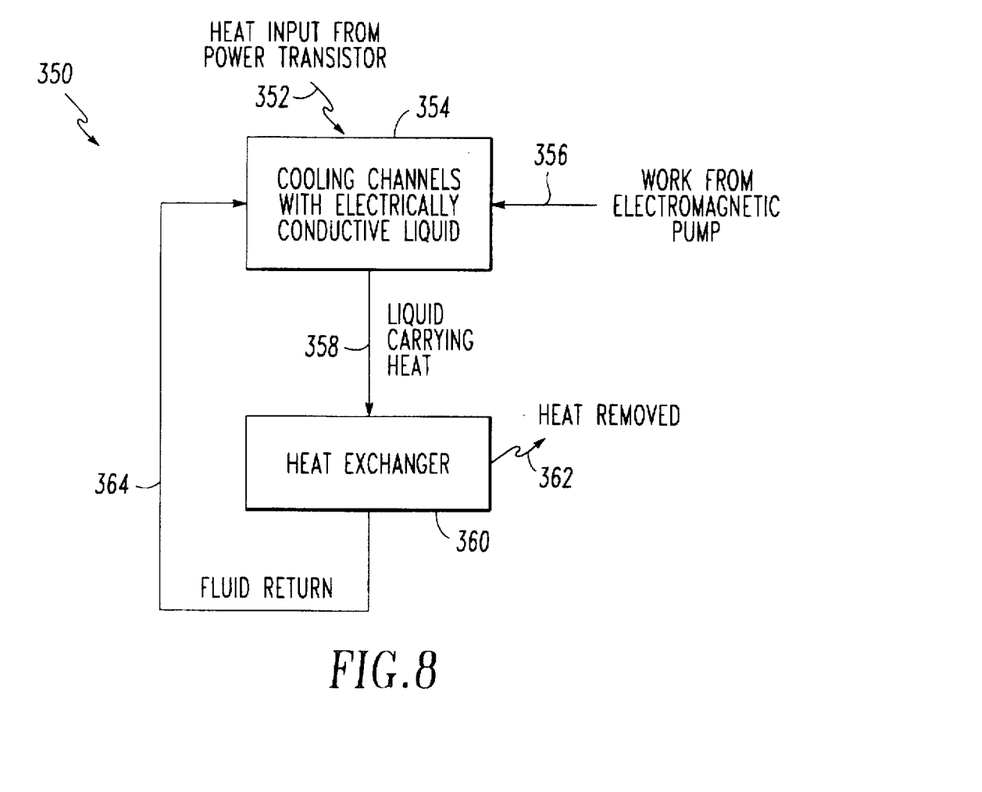
FIG. 8 is a thermal flowchart of the liquid cooling system of the present application.

FIG. 8 depicts a thermal schematic for all of the present embodiments. The arrow 352 indicates heat that is input from the device that is to be cooled, e.g., a power transistor. The box 354 represents the cooling channels within which is held the electrically conductive liquid. The arrow 356 represents the work contributed by the non-mechanical, magnetic pump. The arrow 358 represents heat energy being carried away from the power transistor to the heat exchanger, represented by the box 360. The arrow 362 represents heat being removed by the heat exchanger 360. The arrow 364 represents the return of cooled fluid to the portion of the cooling channel prior to the portion of the cooling channel that is located proximately to the power transistor.

Figure 9:
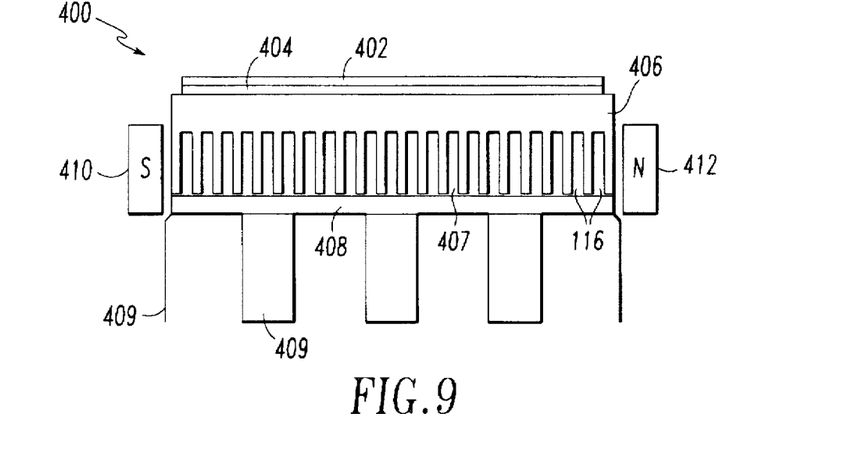
FIG. 9 is a cross-sectional view of the integrated semiconductor device and non-mechanical, magnetic Lorentz force pump of the present application.

FIG. 9 is a cross-sectional illustration of an alternative embodiment of the non-mechanical magnetic pump of the present application, namely an integrated pump/semiconductor device 400. The preferred embodiment of the semiconductor device is a power transistor. The integrated pump/transistor 400 includes: a transistor emitter 402; a transistor base 404; a transistor collector 406; a microchannel 407 for carrying electrically conductive coolant 116; an electrically conductive sealing layer 408; fins 409; a south magnetic pole face 410; and a north magnetic pole face 412.

Figure 10:
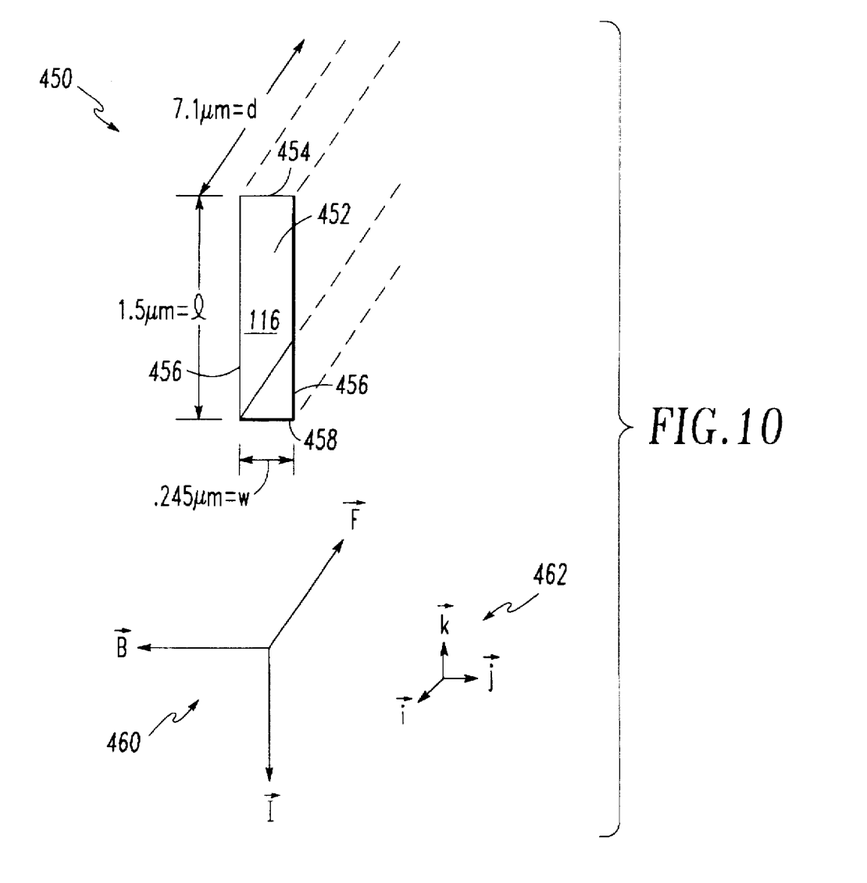
FIG. 10 is a diagrammatic depiction relating the shape of the microchannel to the components of the Lorentz force.

FIG. 10 depicts an exemplary microchannel cross-section 450 of the microchannel 452 of the pump/transistor 400. The microchannel 452 includes: a microchannel sealing 454; microchannel walls 456; and a microchannel floor 458. The orthogonal relationship of the Lorentz force cross product is depicted by the set of axis 460 while the set of axis 462 depict orthogonal reference axes.

In this embodiment, a separate pump is not necessary. In the microchannel 452, $\vec{\tau}$ is the depth of the microchannel. A calculation of an exemplary force magnitude follows. A typical average current available in a transmitter transistor is ½ ampere.

The walls 456, the ceiling 454, and the floor 458 are formed of intrinsic (i.e., undoped) silicon with a resistivity of $\rho = 85$ $(10^3)$ $\Omega$ cm. Using mercury as the exemplary

8 conductive coolant with a resistivity of $\rho = 96$ $(10^{-6})$ $\Omega$ cm, essentially all of the current will travel into the depth of the microchannel 452 via the coolant 116.

The microchannels are so small that a transistor will have on the order of 175 microchannels etched therein. As such, for the sake of illustration, FIG. 9 does not accurately represent the number of microchannels. The current density in the microchannel will be:

$$J = (0.5)/(175 * 0.245(10^{-6}) * 7.1(10^{-6})) = 1.6(10^{-9}) \text{ Amp } m^{-2} \quad (8)$$

In any single channel, the current will be:

$$\vec{i} = 2.9(10^{-3}) \text{ Amp in the } (-\vec{k}) \text{ direction} \quad (9)$$

In other words, the current flows from the channel ceiling 454 towards the channel floor 458 in a direction opposite to the reference axis $\vec{k}$. An exemplary value of the $\vec{B}$ at a distance of 1 cm from the pole face of the exemplary neodymium-iron-boron alloy permanent magnet is 1 tesla (Weber/m$^2$). The $\vec{\tau}$ is $1.5(10^{-6})$ meters in the $-\vec{\underline{i}}$ direction. The force in each microchannel on the coolant is $$\begin{bmatrix} \vec{F} &= 0.0029 * (1.5(10^{-6}) * 1) (-\vec{k} X -\vec{j}) \\ &= 4.4(10^{-9}) \text{ Newtons in } (-\vec{i}) \text{ direction} \end{bmatrix} \quad (10)$$

Recalling that pressure is equal to the force divided by the area, this corresponds to 11,400 pascals (Newtons/m$^2$) on the coolant or 1.6 pounds force per square inch, an adequate pressure to pump an electrically conductive fluid such as mercury through the microchannels 407.

While mercury is the most well-known electrically conductive fluid, there are others that can be used. Other substances that are a liquid at the temperatures at which a power transistor, for example, would operate include Cesium (having a resistivity of $\rho = 36.6(10^{-6})$ $\Omega$ cm), Gallium (having a resistivity $\rho$ $27(10^{-6})$ $\Omega$ cm), and a Sodium-Potassium 50/50 alloy (having a resistivity $\rho \approx 10(10^{-6})$ $\Omega$ cm and having a melting point of 11° C.). Another element, Bromine, is not suitable because it boils at 59° C.

Of these conductors, the 50/50 Na—K alloy is preferred because it has a high thermal conductivity, about 1 watt/(cm C.°), which is more than ten times higher than mercury. Also, the 50/50 Na—K alloy has a specific heat of approximately 0.2 calories/(gram C.°).

The embodiments of the present application employ a non-mechanical magnetic pump to move electrically conductive fluid through a fluid path contained completely on a circuit board assembly. In particular, the fluid path is a microchannel. In some of the embodiments, the device to be cooled is integrated with the pump itself while in others the pump is separated from the devices to be cooled.

The non-mechanical, magnetic pump uses a strong, permanent magnet inducing a field orthogonal to the direction of a high current in order to generate a Lorentz force that moves the electrically conductive fluid. Such a completely intra-circuit-board-assembly liquid cooling system provides the simplicity of air cooling mandated by end users of such circuit boards while achieving the thermal efficiency of a liquid system. A transmitter that employs such a cooling system can extract higher power levels from existing circuit designs than if these circuit boards were cooled only by air. In the alternative, fewer components can be placed on a circuit board and yet still achieve the same performance. This minimizes the parts count for the circuit board assembly, which results in enhanced reliability, and reductions in the system cost, size and weight.

To reiterate the advantages of the present application, a mechanical pump, i.e., one having moving parts, is eliminated. The use of microchannels permits a much smaller capacity pump, such as the non-mechanical magnetic pump, to satisfy the circulation needs of the cooling system. Because the cooling system can fit entirely on a circuit board assembly, the entire cooling system can be permanently sealed.

The invention being thus described, it would be obvious that the same may be varied in many ways. Such variations are not to be regarded as a departure from the spirit and scope of the invention, in all such modifications as would be obvious to one skilled in the art are intended to be included within the scope of the following claims.

I claim the following:

1. An integrated semiconductor device and non-mechanical magnetic pump cooling system, the semiconductor device including at least a first layer of semiconductor material deposited against a second layer of semiconductor material to form a junction, the system comprising:

a channel within the first layer of semiconductor material;

a magnetic field source inducing a magnetic field within, and perpendicular to, a thickness of the first layer; and an electrically conductive fluid within the channel;

an electric current, for energizing the semiconductor device, being transmitted through the first layer parallel to the thickness of the layer;

the fluid in the channel conducting a portion of the current;

the current being orthogonal to the magnetic field such that an orthogonal Lorentz force is exerted on the fluid as a function of a cross product of the electrical current and the magnetic field;

the orthogonal Lorentz force pumping the fluid along the channel, the pumped fluid cooling the junction.

2. A system as in claim 1, wherein:

the channel is a closed loop contained within a circuit card assembly.

3. A system as in claim 1, wherein:

the magnetic field source is at least one permanent magnet.

4. A system as in claim 3, wherein:

the permanent magnet is formed at least in part from a rare earth element.

5. A system as in claim 4, wherein:

the at least one permanent magnet is a neodymium-iron-boron alloy.

6. A system as in claim 1, wherein:

the solid state device is a power transistor.

7. A system as in claim 1, wherein:

the power transistor has a base, emitter, and collector; the first layer being the collector.

8. A system as in claim 1, wherein:

the fluid is one of mercury, cesium, gallium, and a sodium-potassium alloy.

9. A system as in claim 1, further comprising:

a first and second magnetic field source arranged so that a field from each is induced within, and perpendicular to a thickness of, the first layer, the two magnetic fields being aligned so as to combine within the first layer.

10. A system as in claim 9, wherein:

each of the two magnetic field sources are permanent magnets having north and south poles, the south pole of the first magnet being aligned with the north pole of the second magnet to produce the combined field.

11. A system as in claim 1, further comprising:

heat exchanger means, thermally connected to the first layer, for transferring heat via conduction from the fluid in the channel to ambient air adjacent the circuit board via convection, such that fluid approaching the heat exchanger means is of a higher temperature than fluid moving away therefrom.

12. A system as in claim 1, wherein:

the fluid is one of mercury, cesium, gallium, and a sodium-potassium alloy.

13. A system as in claim 1, wherein:

the channel is a microchannel.

* * * * *